US 6,725,463 B1

(12) United States Patent
Birleson (10) Patent No.: US 6,725,463 B1
(45) Date of Patent: Apr. 20, 2004

(54) DUAL MODE TUNER FOR CO-EXISTING DIGITAL AND ANALOG TELEVISION SIGNALS

(75) Inventor: Vince Birleson, West Tawakoni, TX (US)

(73) Assignee: Microtune (Texas), L.P., Plano, TX (US)

( * ) Notice: Subject to any disclaimer, the term of this patent is extended or adjusted under 35 U.S.C. 154(b) by 0 days.

(21) Appl. No.: 08/904,693

(22) Filed: Aug. 1, 1997

(51) Int. Cl.[7] .............................................. H04N 7/173
(52) U.S. Cl. ........................ 725/151; 348/731; 348/555; 348/558; 455/143; 455/259; 455/260; 455/265; 331/22; 331/32
(58) Field of Search ................................ 348/731, 554, 348/726, 10, 441, 558, 555, 553, 584; 455/3.2, 6.2, 137, 189.1, 74, 143, 22, 550, 553, 307, 313, 314; 375/270, 321, 216; 331/22–32; 725/37, 151–153, 131–142; 345/731, 732; H04N 5/50, 7/10

(56) References Cited

U.S. PATENT DOCUMENTS

| | | | | |
|---|---|---|---|---|
| 4,385,402 A | * | 5/1983 | Barrs ........................ | 455/307 |
| 4,581,643 A | | 4/1986 | Carlson | |
| 4,726,072 A | | 2/1988 | Yamashita et al. | |
| 4,742,566 A | | 5/1988 | Nordholt et al. | |
| 4,979,230 A | | 12/1990 | Marz | |
| 5,038,404 A | | 8/1991 | Marz | |
| 5,060,297 A | | 10/1991 | Ma et al. | |
| 5,200,826 A | | 4/1993 | Seong | |
| 5,311,318 A | | 5/1994 | Dobrovolny | |
| 5,361,099 A | * | 11/1994 | Kim ........................... | 348/555 |
| 5,390,346 A | | 2/1995 | Marz | |
| 5,428,836 A | | 6/1995 | Sanecki et al. | |
| 5,557,337 A | * | 9/1996 | Scarpa ........................ | 348/558 |
| 5,563,545 A | | 10/1996 | Scheinberg | |
| 5,572,264 A | * | 11/1996 | Mizukami et al. ........... | 348/735 |
| 5,638,112 A | * | 6/1997 | Bestler et al. ............... | 348/584 |
| 5,715,012 A | * | 2/1998 | Patel et al. .................. | 348/565 |
| 5,737,035 A | * | 4/1998 | Rotzoll ........................ | 348/725 |
| 5,950,112 A | * | 9/1999 | Hori et al. ................... | 455/3.2 |
| 6,014,178 A | * | 1/2000 | Jeon et al. ................... | 348/554 |
| 6,094,564 A | * | 7/2000 | Tomiya et al. ............... | 455/73 |
| 6,377,315 B1 | * | 4/2002 | Carr et al. ................... | 348/726 |

OTHER PUBLICATIONS

Kinget, Peter and Michiel Steyaert. "A 1 GHz CMOS Upconversion Mixer", IEEE Custom Integrated Circuits Conference. (1996) 197–200.

Crols, Jan, and Michel S. J. Steyaert. "A 1.5 GHz Highly Linear CMOS Downconversion Mixer." IEEE Journal of Solid–State Circuits. vol. 30 No. 7 (Jul. 1995). 736–742.

Kuhn, William B., William Stephenson, and Aicha Elshabini–Raid. "A 200 MHz CMOS Q–Enhanced LC Bandpass Filter." IEEE Journal of Solid–State Circuits. vol. 31 No. 8 (Aug. 1996). 1112–1122.

(List continued on next page.)

Primary Examiner—Andrew Faile
Assistant Examiner—Reuben Brown
(74) Attorney, Agent, or Firm—Fulbright & Jaworski L.L.P.

(57) ABSTRACT

A dual mode tuner/receiver is disclosed in which both analog and digital signals can be received and processed. A low pass filter allows all channels below a selected frequency enter the circuit. A precisely controlled dual conversion circuit creates an intermediate frequency (IF) signal. An automatic carrier detection circuit monitors the IF signal and determines whether the signal is of analog or digital format and intermediate frequency filters are adjusted based upon the type of signal detected. A coherent oscillator circuit generates in-phase and quadrature reference signals that are used by video and audio detectors for further processing of the IF signal. In-phase and quadrature outputs are provided for digital signals and composite video and audio outputs are provided for analog signals.

89 Claims, 7 Drawing Sheets

OTHER PUBLICATIONS

Razavi, Behzad, Kwing F. Lee, Ran–Hong Yan, and Robert G. Swartz. "A 3–GHz 25–mW CMOS Phase–Locked Loop." 1994 Symposium on VLSI Circuits Digest of Technical Papers. (1994). 131–132.

McGinn, Mike. "An Advanced I.F. Amplifier & AFT System Suitable for HDTV." IEEE Transactions on Consumer Electronics. vol. 36 No. 3 (Aug. 1990) 407–414.

Okanobu, Taiwa, Hitoshi Tomiyama, and Hiroshi Arimoto. "Advanced Low Voltage Single Chip Radio IC." IEEE Transactions on Consumer Electronics. vol. 38 No. 3. (Aug. 1992) 465–475.

Crols, Jan, and Michiel Steyaert. "An Analog Integrated Polyphase Filter for a High Performance Low–IF Receiver." 1995 Symposium on VLSI Circuits Digest Of Technical Papers. (1995) 87–88.

Anadigics, Inc. CATV/TV/Cable Modem Upconverter MMIC. Warren NJ (Apr. 22, 1998).

Anadigics Inc. VHF/UHF CATV/TV Tuner Dowconverter. Warren, NJ. (Apr. 22, 1998).

Anadigics, Inc. Anagics Technical Brief. Upconverter MMIC for CATV Preliminary. Warren, NJ. (Jan. 11, 1994).

Boutin, Noel. "Complex Signals: Part 1—Part IV" RF Featured Technology. (Dec. 1989). 27–75.

Kuhn, William B. "Design of Monolithically Integrated Radio Transceivers" Kansas State University.

Scheinberg, N., et al. "A GaAs Up Converter Interated Circuit for a Double Conversion Cable TV "Set–Top" Tuner" International Conference on Consumer Electronics. (Jun. 1993). 108–109.

Maier, G.M., et al. "Double Conversion Tuner a Must for the Future?" IEEE Transaction on Consumer Electronics, vol. 38, No. 3. (Aug. 1992). 384–388.

Muller, J–E., et al. "A Double–Conversion Broad Band TV Tuner with GaAs ICs." GaAs IC Symposium Technical Digest. (1984). 97–98.

Brady, Vernon, et al. "Development of a Monolithic FET Ka–Band Single Side Band UFConverter and Image Reject Downconverter." GaAs Symposium Technical Digest (Oct. 1989) 189–192.

Ablassmeier, Ulrich, et al. "GaAs FET Upconverter for TV Tuner" IEEE Transactions on Electron Devides, Vol ED–27, No. 6. (Jun. 1980). 1156–1159.

Pandula, Louis. "Image ReJect and Image Canceling Mixers" RF Design. (Apr. 1995). 60–65.

Giles, Martin. "The LM 1823: A High Quality TV Video I.F. Amplifier and Synchronous Detector for Cable Receivers." National Semiconductor Corporation. (Mar. 1985). 1–16.

Ducourant, Thierry, et al. "A 3 Chip GaAs Double Conversion TV Tuner System with 70 db Image Rejection." Monolithic Circuits Symposium Digest of Papers. (1988). 87–90.

Torii, K., et al. "monolithic Integrated VHF TV Tuner." IEEE Transactions on Consumer Electronics, vol. CE–26. (May 1980). 180–189.

Loveland, David, et al. "Silicon Upconverter RF IC Simplifies Cable Modem Designs" Microwaves & RF (Mar. 1997). 136–142.

Farmer, James O. "Specifications for Tuner Design for use in Cable Ready Television Receivers and VCRs." IEEE Transactions on Consumer Electronics, vol. 36, No. 3,. (Aug. 1990). 660–668.

Crols, Jan and Michiel Steyaert. "A Fully integrated 900MHz CMOS Double Quadrature Downconverter" IEEE International Solid–State Circuits Conference. (1995). 136–137.

Sabin, William E. & Edgar O. Schoenike. "Single –Sideband Systems & Circuits." McGraw Hill Book Company. New York. (1987). 88–134, 181–213.

MC44302: Advanced Multi–Standard TV Video/Sound IF, Motorola, Inc. (Jun. 17, 1994).

* cited by examiner

DUAL MODE TUNER FOR CO-EXISTING DIGITAL AND ANALOG TELEVISION SIGNALS

RELATED APPLICATIONS

This application is related to application entitled INTERFERENCE-FREE BROADBAND TELEVISION TUNER assigned Ser. No. 08/904,906, application entitled BROADBAND INTEGRATED TELEVISION TUNER assigned Ser. No. 08/904,908 and copending application BROADBAND FREQUENCY SYNTHESIZER assigned Ser. No. 08/904,907, all of which are filed concurrently herewith and assigned to a common assignee, which applications are hereby incorporated by reference herein.

TECHNICAL FIELD OF THE INVENTION

This invention relates to television receiver tuners and more particularly to such tuners that are used to detect and process both digital and analog signals.

BACKGROUND OF THE INVENTION

Conventional tuners are composed of discrete devices, such as tuning coils, tracking filters and phase locked loop filters, which require manual tuning. These external tuning requirements result in extra expense and add time to the manufacturing process. Generally, prior art tuners are designed to process a narrow range of frequencies at any one time. This is accomplished by a tracking filter on the front end of the tuner. As the receiver is tuned across the frequency band during a channel change the tracking filter is tuned to allow only a few channels to pass into the tuner. As a result, the tuner circuit only has to work with a few channels instead of the entire bandwidth. For example, in a cable television system the tuner would allow only a few channels to enter the receiver front end, instead of the full 100 or more channels in the total cable set. The cable channels could be at full strength of about 15 dBmV. The effect of the tracking filter is to reduce the dynamic range required in the front end of a conventional receiver.

For analog television signals there is a large picture carrier which contains most of the power, this requires a large receiver dynamic range. The analog television signal waveform is vestigial side band (VSB), which is similar to single side band transmission. However, in VSB transmissions there is some signal spillage over to the unwanted side band. To compensate for this unwanted spillover, a special filter is used in the intermediate frequency (IF) processing portion of analog tuners to suppress the carrier approximately 6 dB to compensate for the difference in side band signal level. Typically, surface acoustic wave (SAW) filters are used to suppress the unwanted side band. It is critical that the carrier signal be positioned properly on the frequency response of the SAW filter to ensure that the picture carrier passes.

Analog television signals contain an audio carrier and a chroma carrier in addition to the main picture carrier signal. The audio carrier frequency is 4.5 MHz higher than the picture carrier. Normally there is a filter, such as the SAW filter in the IF, which suppresses the audio carrier approximately 20 dB to prevent intermodulation problems between the carriers in the video channel. The picture carrier, audio carrier and chroma carrier tend to beat together and cause spurious signals.

Digital television signals can be used instead to overcome the problems caused by the format of analog television signals. Although the format for digital television signals has not been standardized to date, there are common pieces among the proposed formats. Primarily, the digital signal is expected to have band shape that is fairly flat across approximately 6 MHz. This 6 MHz bandwidth could have within it several different selectable regions (channels) of intelligent signals. The digital TV reference signal will be small and would be about 6 dB below the average pictures (or desired data) signal level. The digital signal would have information spread uniformly across the 6 MHz band. Sound would be part of the signal and there would not be a separate digital sound carrier. Thus, the tuner must be functional to capture each 6 MHz band and then allow for decoding therefrom one or more channels of programming or data.

Whichever final standards are chosen for digital television, there will be significant variations between the analog and digital signal formats. Therefore, existing processors which currently handle analog signals will not be able to process future digital signals. An example of a television tuner having no front end tracking filter is disclosed in the above-referenced co-pending application entitled MONOLITHIC TELEVISION TUNER. However, the television tuner disclosed in that application for patent does not provide for tuning television signals in more than one format. Therefore, in order to receive both analog format signals and digital format signals, a television would have to use two or more of such tuners, where each tuner is designed to receive a different format. If a television used multiple tuners, it would also need some way of determining when to select between the various tuners in order to properly receive different channels that each have a different format.

SUMMARY OF THE INVENTION

The present invention allows both analog and digital signals to be received by a single tuning circuit which may, if desired, be embodied as a single integrated device. The narrow band tracking filter of the prior art is replaced by a front end filter having a wide band pass that permits all channels in a desired band to pass into the circuit. Frequencies above the desired band are rejected.

A dual conversion circuit is used to convert a desired channel in the received signal to an intermediate frequency for further processing. The first mixer of the conversion circuit has a high dynamic range which allows it to receive all channels, voltage controlled oscillators (VCOs) driven by multiple phase locked loops (PLLs) are used to provide the local oscillator (LO) signal for the conversion circuit mixers. The PLLs allow for precisely stepped LO frequencies in the conversion circuit.

A first intermediate frequency filter (FIFF) operates in conjunction with the second conversion circuit mixer to provide image rejection. Two second intermediate frequency filters (SIFFs) are selectively switched into the intermediate frequency (IF) signal path to create an overall bandpass characteristic that is alternatively suitable for either digital or analog television signals. An automatic carrier detection (ACD) circuit monitors the output of both SIFFs and determines whether the signal being processed is in the digital or analog format. The output of the selected SIFF combination is an IF signal that is provided either to an off-chip decoder device or to additional on-chip circuitry for further processing.

A coherent oscillator (COHO) circuit is used to create both in-phase (0° phase shift) and quadrature (90° phase shift) reference signals from the IF signal. A frequency discriminator monitors the output of the COHO to ensure proper signal tracking.

A first mixer receives the in-phase reference signal and operates as either a video detector for analog signals or an in-phase detector for digital signals. The video detector provides signals to both composite video and digital I-channel circuits for further processing. A third signal from the video detector is provided to an automatic gain control (AGC) circuit. The AGC circuit controls the overall gain by adjusting the gain of an IF amplifier at the output of the SIFFs and a delayed amplifier at the front end of the tuner.

A second mixer receives the quadrature reference signal from the COHO and operates as either an audio down converter for analog signals or a quadrature detector for digital signals. The audio down converter provides signals to an audio detector and to a digital Q-channel circuit.

The overall operation of the circuit is such that a broadcast signal is received through the front end filter and then converted to an IF signal by the dual conversion circuit. The IF signal then passes through the SIFFs while the ACD circuit monitors the outputs of the SIFFs to determine whether the signal is in analog or digital format. Once the signal type is determined, the second SIFF is switched in or out of the IF signal path as appropriate to provide the proper overall bandpass characteristic for that signal type. The output of the SIFFs can be provided to an off-chip decoder device or it may remain on-chip. For digital signals, after passing through the in-phase and quadrature detectors the signals are further processed and output as the digital I and Q channels. For analog signals, after passing the video detector and audio down converter, the signals are processed and output as composite video and audio signals. The overall control of the circuit is accomplished through a control interface circuit and a processor, such as a computer.

It is one technical advantage of the present invention to provide a tuner circuit having a front end with a high dynamic range which allows reception and processing of all channels in a desired band.

It is another technical advantage of the present invention to provide a tuner that is capable of determining whether a received channel contains an analog signal or a digital signal and after identifying the signal type automatically adjusting and optimizing the overall frequency response of the tuner.

It is a further technical advantage of the present invention to provide a tuner which is capable of processing analog and digital signals on a single integrated device.

It is a further technical advantage of the present invention to provide a tuner that can be used in a variety of applications beyond a conventional television set. The present invention can also be incorporated into a computer or other device as an integral component or as an add-in board.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Figure 1:
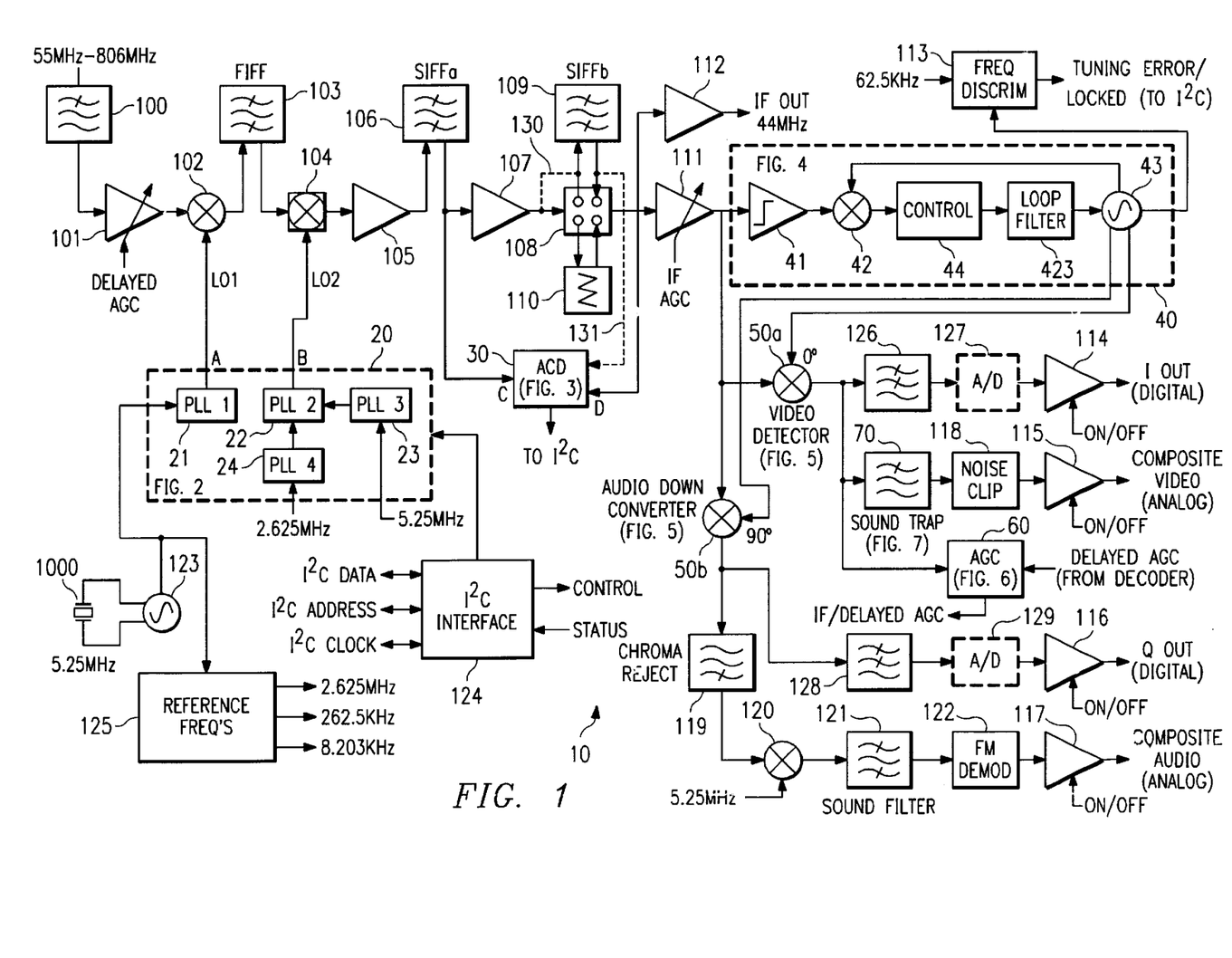
FIG. 1 is a high level block diagram of the disclosed dual mode tuner.

These and other objects, features and technical advantages are achieved by a system and method in which digital and analog signal processing is accomplished in one device across the full digital and analog television band. The disclosed tuner is constructed with substantially all of the components on a single integrated circuit. FIG. 1 is a high level block diagram which shows the components of the preferred embodiment of a dual mode tuner for coexisting digital and analog television signals. Signals enter tuner 10 through low pass filter 100. The cut-off frequency for filter 100 is selected based upon the television system in which tuner 10 is implemented. In the United States, filter 100 would cut off frequencies above approximately 806 MHz. In a European television system the cut-off frequency could be higher depending upon the frequency band of the relevant television channels. In either system, the cut-off frequency of filter 100 is selected to suppress image frequencies. The disclosed tuner 10 does not require a tracking filter on the front end. Instead filter 100 allows a broad band of frequencies to pass, subject only to the high frequency cutoff.

The output of filter 100 is provided to variable-gain low-noise amplifier 101. Amplifier 101 is capable of operating as a delayed automatic gain control (AGC) amplifier that is controlled by an AGC circuit. The AGC circuit that controls amplifier 101 will be discussed below in connection with item 60 and FIG. 6. Amplifier 101 provides delayed AGC to prevent the front end of tuner 10 from saturating. It is important that amplifier 101 is designed to have a very good noise figure, on the order of 5 or 6 dB, and very high intercept points to minimize distortion.

Mixer 102 accepts the output of amplifier 101 as one of its inputs. The other input to mixer 102 is a local oscillator (LO1) signal generated by phase locked loop 1 (PLL1) 21. Both mixer 102 and amplifier 101 should have a very high dynamic range in order to handle the full television band. The television band can be up to 100 channels in the case of cable television and the signal strength of each channel can be as high as +15 dBmV. Mixer 102 and amplifier 101 must have high third order and second order intercept points to minimize signal distortion. In the preferred embodiment, mixer 102 is a Gilbert cell mixer that has been designed to have a good noise figure and a high intercept point.

Following mixer 102, the signal passes through first intermediate frequency filter (FIFF) 103. FIFF 103 is intended to select down from the entire television band to just a few channels. Accordingly, it has to handle the 6 MHz television channel bandwidth plus some extra bandwidth to account for tuning and fine tuning in the LOs. In the preferred embodiment, FIFF 103 will nominally be 15 MHz wide. FIFF can either be an on-chip or an off-chip device. In the preferred embodiment FIFF 103 would be on-chip, however, design considerations may require that an off-chip filter be used for FIFF 103.

Mixer 104 receives the output of FIFF 103 and mixes it with a second local oscillator (LO2) signal generated by PLL2 22. PLL2 22 operates in conjunction with PPL3 23 and PLL4 24. Mixer 104 is an image reject mixer that works with FIFF 103 to suppress image frequencies from the output of mixer 104. The signal coming out of filter 103 is split into two signals, one at 0° phase and the other at 90° phase. The second LO signal from PLL2 22 is also composed of signals at 0° and 90°. These signals are applied to two mixers, the output of which is combined with the effect of rejecting the image frequency. The dynamic range of mixer 104 does not have to be as broad as mixer 102 because FIFF 103 has the effect of filtering the signal down to just a few channels.

The channel tuning in circuit 10 is accomplished by the LO1 and LO2 signals generated by tuning circuit 20. Coarse tuning is accomplished in mixer 102 by LO1. In the preferred embodiment, LO1 is generated by PLL1 21 and has a step size of 5.25 MHz. Fine tuning is performed in mixer 104 by LO2. LO2 is generated using three phase locked loops PLL2-4 22-24 and has a step size of 62.5 KHz. The operation of PLL1-4 21-24 will be further discussed as part of FIG. 2.

Figure 9:
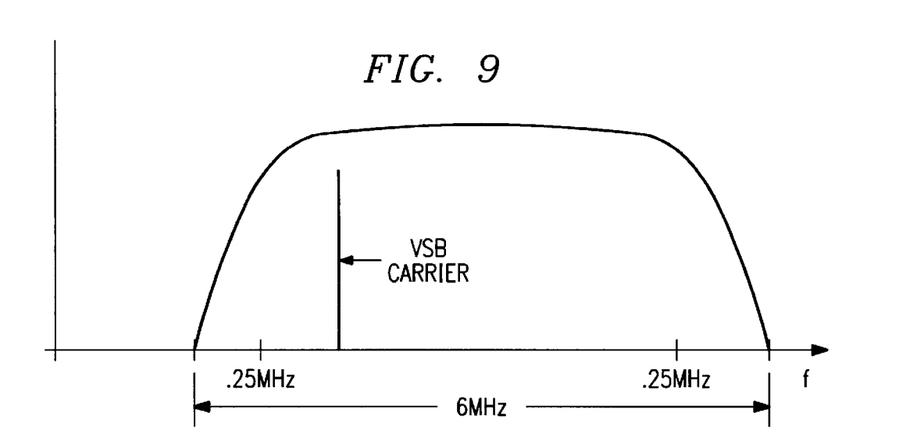
FIG. 9 shows the preferred symmetrical frequency response in the second intermediate frequency filters (SIFFs) for a digital signal.

Following mixer 104, the signal passes through amplifier 105. Amplifier 105 provides gain for the signal before it goes into second intermediate frequency filter "a" (SIFFa) 106. In a preferred embodiment, SIFFa 106 and FIFF 103 would be on-chip. Design considerations may suggest using off-chip filters for FIFF 103, SIFFa 106 or SIFFb 109. In an alternative embodiment, combinations of on-chip and off-chip filters may be used for FIFF 103, SIFFa 106 or SIFFb 109. SIFFa 106 is chosen to have a pass band that is suitable for digital television signals. The pass band would be relatively flat over a 6 MHz frequency span as illustrated in FIG. 9.

Amplifier 107 amplifies the signal following SIFFa 106. If tuner circuit 10 is embodied so that filters 103, 106 and 109 are off-chip devices, then they can typically be expected to have insertion loss of 3 to 15 dB. Amplifier 107 provides gain to compensate for the signal loss in SIFFa 106, and may not be required.

Following amplifier 107 is switch 108 which provides a selection between the second intermediate frequency filter "b" (SIFFb) 109 and attenuator 110. Attenuator 110 is chosen to match the insertion loss of filter 109. As a result, the signal loss across switch 108 will effectively remain the same and not vary with switch position. In the preferred embodiment, switch 108 is selected to have isolation approximately 10 dB better than the analog audio suppression that is provided in SIFFb 109. Typically, the analog audio suppression is 20 dB, so switch 108 would be selected to have 30 to 35 dB isolation.

Figure 8:
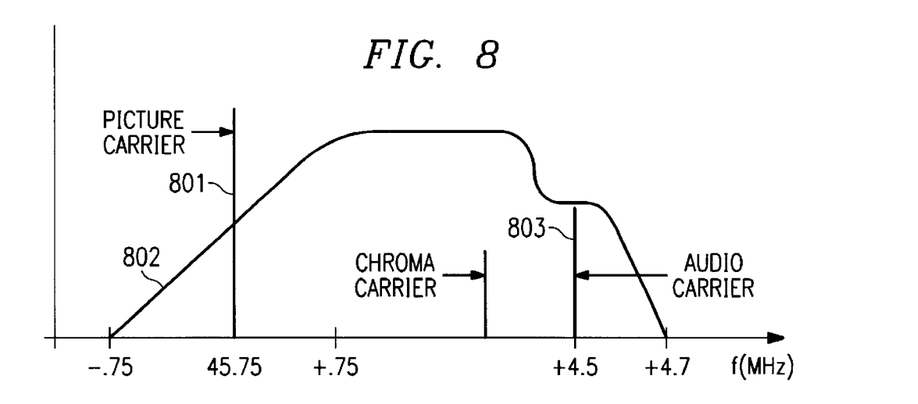
FIG. 8 shows the preferred frequency response in the second intermediate frequency filters (SIFFs) for an analog signal and the relationship between the picture, chroma and audio carriers.

SIFFb 109 is designed to work in conjunction with SIFFa 106 to provide the band pass characteristics that are necessary for analog television signal processing. A typical analog signal pass band is illustrated in FIG. 8. In the preferred method of operation, switch 108 selects SIFFb 109 into the signal path when an analog television signal is detected. As a result, the combined pass band through SIFFa 106 and SIFFb 109 will be similar to that shown in FIG. 8 and will be optimized for processing the analog signal. If a digital television signal is detected, switch 108 selects attenuator 110 into the signal path. The resulting band pass of SIFFa 106 and attenuator 110 will be similar to FIG. 9 and will be optimized for digital television signal processing.

In an alternative approach (not shown), an analog band pass filter equivalent to the combination of SIFFa 106 and SIFFb 109 could be placed in parallel with digital filter SIFFa 106. This arrangement would allow the analog and digital signal filters to be independent, but it would also require that switch 108 have an isolation on the order of 50 dB to prevent signals from leaking around the filters.

The output of switch 108, either from SIFFb 109 or attenuator 110, is then provided to IF AGC amplifier 111. Amplifier 111 is a variable gain IF amplifier that provides the gain adjustment for the AGC circuit. Typically, amplifier 111 has a gain between 25 and 75 dB. The gain level is controlled by AGC control 60. A key characteristic of amplifier 111 is a noise figure on the order of 15 dB with high output intercept points on the order of +78 dB.

In parallel with amplifier 111 is buffer 112, which is a high end buffer output that provides a 44 MHz IF signal for external devices, such as a decoder, where the signal can be further processed off chip.

The output of amplifier 111 is provided to coherent oscillator circuit (COHO) 40. COHO 40 creates two reference signals and provides them to elements 50a and 50b. A 0° phase signal, relative to the carrier signal, is provided from COHO 40 to detector 50a, which operates either as a video detector for analog television signals or as an in-phase down converter for digital television signals. COHO 40 also provides a 90° phase signal to detector 50b, which either operates as an audio down converter for analog television or as a quadrature detector for digital television.

COHO 40 is a phase lock loop reference that locks on the carrier for the received analog or digital television signal. For an analog signal, the loop requires a bandwidth on the order of 25 KHz. On the other hand, because the digital carrier is at a much lower level, a digital signal requires a bandwidth on the order of 1 KHz. Therefore, in the preferred embodiment, COHO 40 is designed to work on the digital bandwidth since it is within the analog bandwidth requirements. In contrast to a normal single conversion receiver, a narrow loop bandwidth can be used in tuner circuit 10 because the close-in noise of LO1 and LO2 is very good. Typically, in a single conversion receiver, the loop bandwidth of the first local oscillator is narrow which creates high noise close-in. That noise would have to be suppressed with a wide bandwidth COHO. In the preferred embodiment, the improved noise characteristics of LO1 and LO2 allow the use of COHO 40 with a narrow loop bandwidth.

In addition to the signals provided to detectors 50a and 50b, COHO 40 also provides an output to frequency discriminator 113. Frequency discriminator 113 measures the actual frequency of the carrier signal that tuner circuit 10 is processing. This frequency information is provided to Inter Integrated Circuit interface, I²C 124, which then adjusts PLL1-4 21 24 as necessary to retune circuit 10. I²C is a well-known standard, defined by Philips Electronics N.V., but any digital interface will work. As shown in FIG. 8, it is critical to place picture carrier 801 on the vestigial sideband slope 802 of the analog filter pass band. If picture carrier 801 is not properly positioned, the circuit will be retuned so that the carrier is at 45.75 MHz, plus or minus 35 KHz.

Figure 7A:
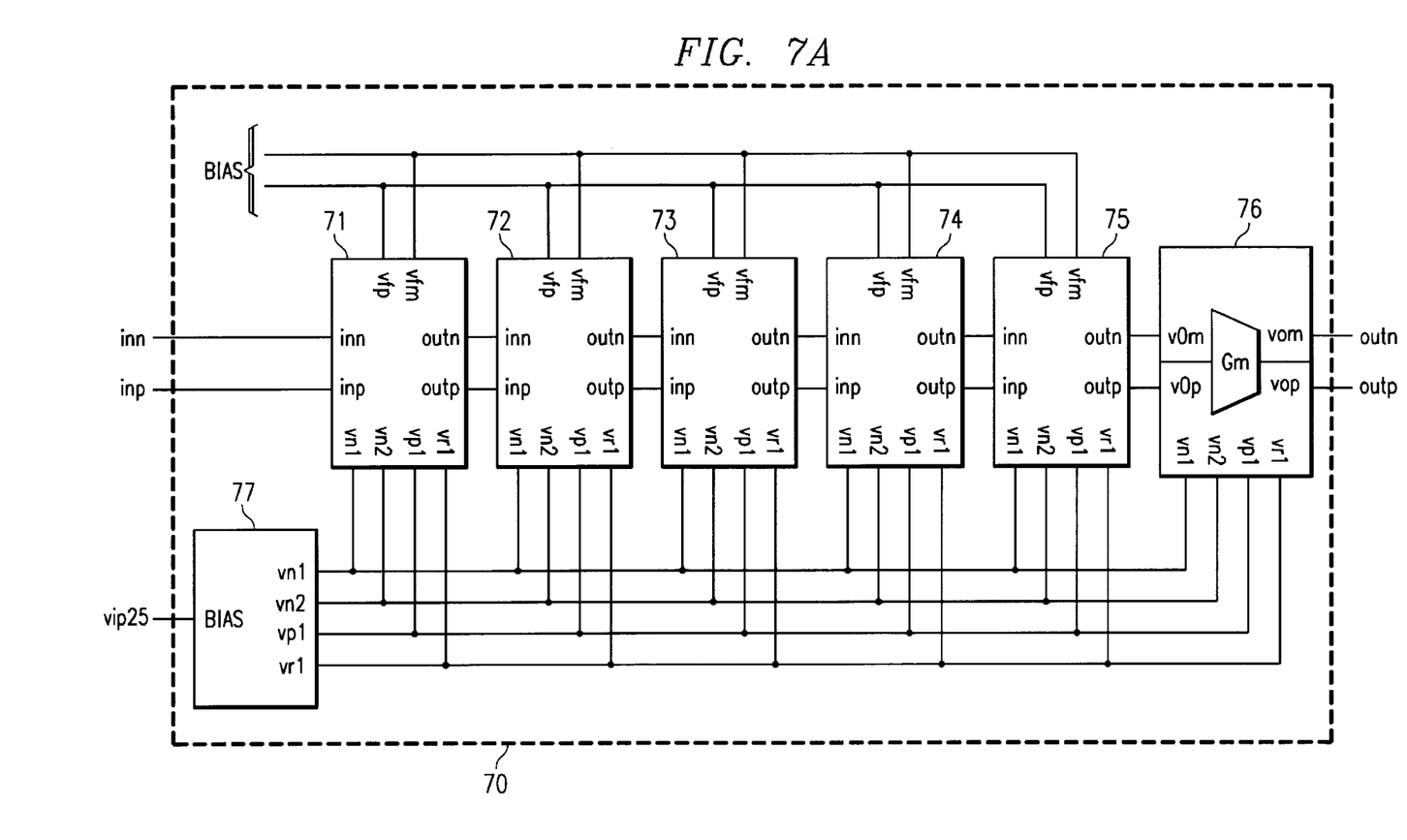
FIG. 7A shows the preferred embodiment of the sound trap circuit used in the present invention.
Figure 7B:
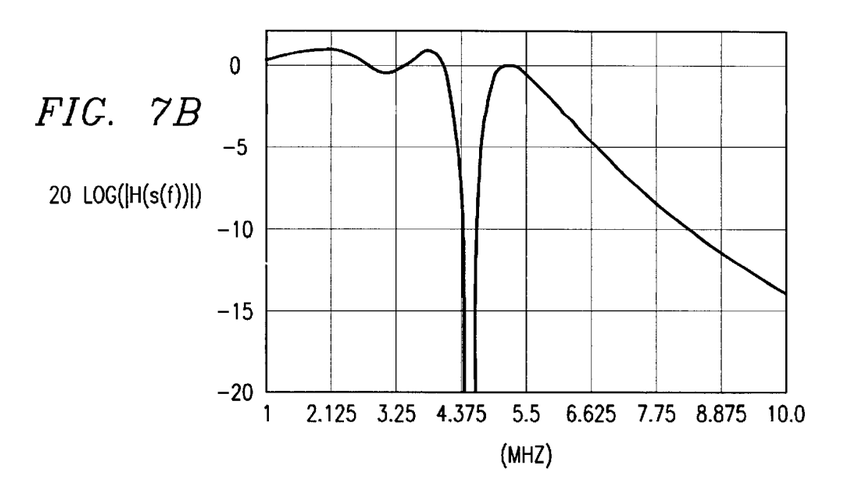
FIG. 7B shows the frequency response of the sound trap circuit of FIG. 7A.

The output of amplifier 111 also directly drives video detector 50*a* and audio detector 50*b*. Video detector 50*a* drives the in-phase digital channel, the analog video channel and automatic gain control (AGC) circuit 60. The analog video channel includes sound trap 70 which is a filter with a notch at the audio signal frequency of 4.5 MHz above the carrier. In the preferred embodiment, suppression at the trap frequency is on the order of 35 db. Also, sound trap 70 should have very little in-band distortion. It is desirable that sound trap 70 roll off above the audio signal trap frequency to suppress any out-of-band spurious signals or noise from video detector 50*a*. The frequency response of the preferred embodiment of sound trap 70 is shown in FIG. 7B.

In parallel with the analog video channel is the in-phase channel for digital television signals. In this path, the signal first passes through low pass filter 126 to suppress out of band noise and spurious signals. In the preferred embodiment, output buffer 114 follows filter 126 and sets the levels for the digital I channel output signal. In an alternative embodiment, analog-to-digital (A/D) converter 127 could be placed between filter 126 and buffer 114. If A/D converter 127 is used in the circuit, then the output from buffer 114 would be digital. In this embodiment, an off-chip A/D converter would not be needed.

Sound trap 70 drives noise clipping circuit 118 which clips off high frequency noise that could cause either high white levels or black levels. Following noise clipping circuit 118 is output buffer 115. Buffer 115 sets the signal level for the composite video output to approximately 1 volt peak-to-peak. Buffer 115 also has a control input which can turn the output signal on and off.

AGC circuit 60 is the third path that is driven by detector 50*a*. AGC 60 measures the signal level output from detector 50*a* and maintains a constant level at this point in circuit 10. The signal from video detector 50*a* is compared with a reference signal provided by I²C 124. AGC 60 controls the gain of circuit 10 by adjusting IF AGC amplifier 111 and delayed AGC amplifier 101. In the preferred embodiment, AGC 60 first adjusts IF AGC amplifier 111 to control the overall gain of tuner 10. Once the gain gets to a specified minimum level, on the order of 25 dB, then AGC 60 adjusts delayed AGC amplifier 101 to attenuate the signal at the front end of tuner 10.

A delayed AGC signal from a decoder (not shown) can also be used by AGC 60 to control the gain of tuner 10. Such a delayed signal could come from an off-chip decoder that is driven by the output of buffer 112. When the decoder is active it could provide an AGC signal that would pass through AGC circuit 60 to directly control the gain of amplifier 101 and IF AGC amplifier 111.

Audio detector 50*b* uses the 90° signal from COHO 40. The output of detector 50*b* drives the audio channel for analog television and the quadrature channel for digital television. The quadrature channel has a low pass filter 128 of the same design as filter 126 in the in-phase digital channel. Filter 128 suppresses out-of-band noise and spurious signals and has a bandwidth on the order of 6 MHz. In the preferred embodiment, the signal from filter 128 is passed through buffer 116 which has a control input to turn it on and off. Buffer 116 sets the output levels for the digital Q-channel. In an alternative embodiment, A/D converter 129 may be placed between filter 128 and buffer 116. A/D converter 129 would allow for direct digital output through buffer 116 without the need for an off-chip A/D converter for the digital signals.

The signal on the analog audio channel first passes through chroma reject filter 119. Filter 119 is a high pass filter designed to suppresses any remaining luminance signal and to suppress the chroma carrier signal at approximately 3.58 MHz. The audio signal which is intended to be passed through filter 119 is at 4.5 MHz after down converter 50*b*. The output of filter 119 is down converted in mixer 120. The 4.5 MHz audio signal is mixed with a 5.25 MHz reference signal in mixer 120 to produce a 750 KHz output. The 750 KHz signal is then filtered by sound filter 121. The bandwidth of sound filter 121 is approximately 200 KHz. Sound filter 121 is an on-chip circuit in the preferred embodiment. In an alternative embodiment, sound filtering could also be accomplished off-chip. If an off-chip device is used for sound filter 121, then the filtering would be accomplished following the chroma reject filter 119 and the down conversion by mixer 120 would not be done. Instead, the output of the off-chip sound filter would go directly into FM demodulator 122.

In the preferred embodiment, the output of sound filter 121 is provided to FM demodulator 122. FM demodulator 122 is a delay line type of demodulator in which the signal is split two ways. One path goes through a time delay and the other path goes into a multiplier circuit which produces an AM signal from the FM signal. In the preferred FM demodulator 122, the time delay is a 90° phase shift at center frequency. The output of FM modulator 122 drives audio output buffer 117 which sets the proper levels for the audio signal. Buffer 117 also has an on/off or mute control for the audio output.

The reference signals used by tuner circuit 10 are generated using, preferably, an off-chip 5.25 MHz crystal 1000 that is connected to oscillator circuit 123. Circuit 123 is on-chip and produces the basic 5.25 MHz reference signal for tuner 10. The 5.25 MHz signal drives reference frequency generator 125 which produces the other reference signals required by tuner 10. The other reference signals include a 2.625 MHz signal which is used in PLL4 24, a 262 KHz signal which is used for audio tuning and a 8.2 KHz signal which is used in the AGC circuit 60.

Figure 2:
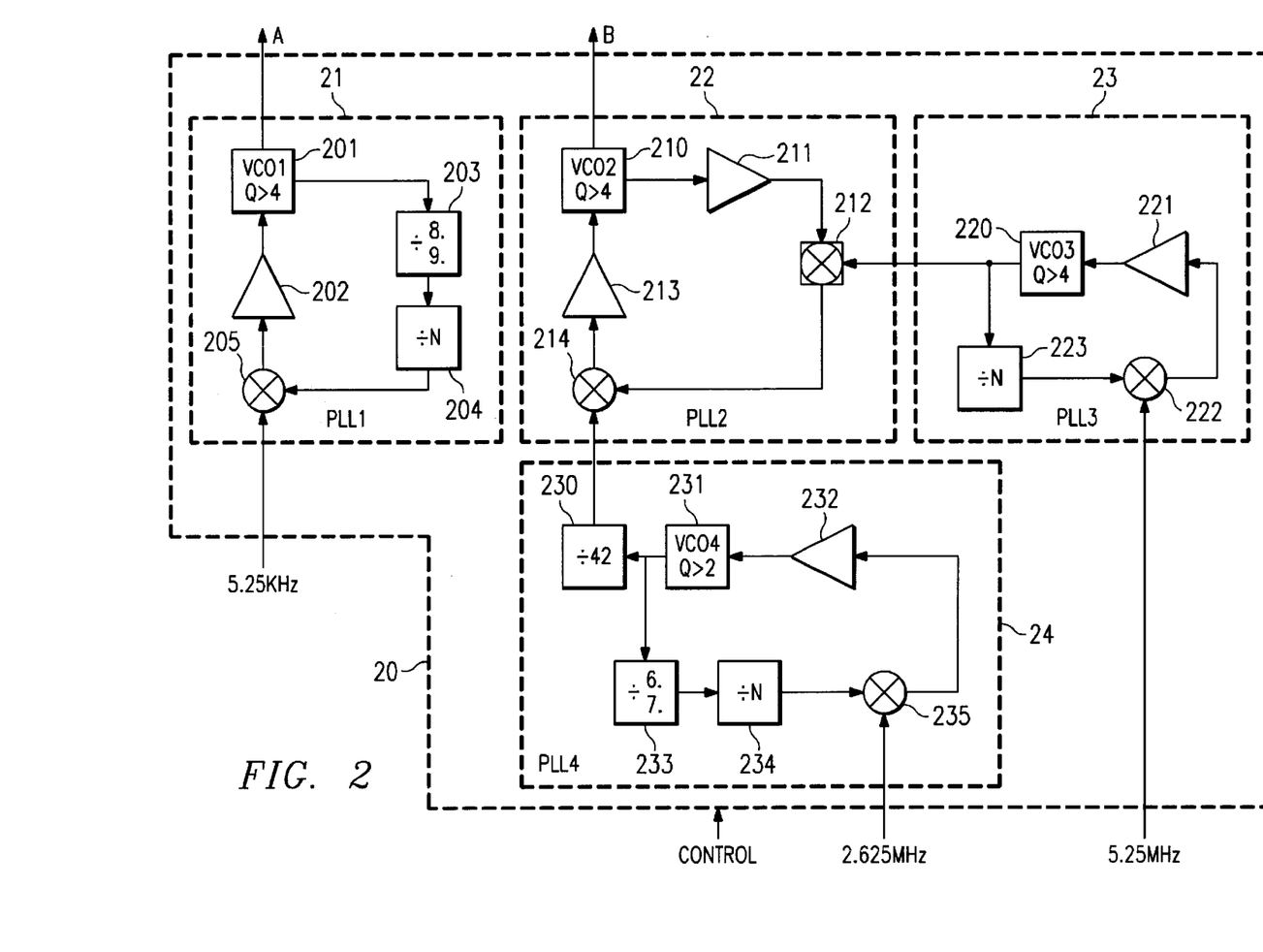
FIG. 2 is a block diagram of the phase locked loops and voltage controlled oscillators that are used to provide the local oscillator signals for the disclosed dual mode tuner.

Turning now to FIG. 2, the four phase locked loops which produce the local oscillator signals for tuner 10 are shown. PLL1 21 provides the first local oscillator signal (LO1) to mixer 102. PLL2 22, PLL3 23 and PLL4 24 operate to provide the second local oscillator signal (LO2) to mixer 104. Concurrently filed, co-pending application entitled "Interference Free Broadband Television Tuner" discusses the operation of tuning circuit 20 in greater detail and is incorporated by reference herein.

PLL1 21 receives a 5.25 MHz reference signal at phase comparator 205. The output of phase comparator 205 feeds loop amplifier 202 which, in turn, provides the input for VCO1 201. There are two outputs from VCO1 201. One output provides the LO1 signal to mixer 102 over line A. The other output goes into a divider network comprised of ÷8/÷9 circuit 203 and ÷N circuit 204. Divider circuits 203 and 204 divide the output of VCO1 201 down to a signal having a frequency of 5.25 MHz. This divided-down signal is compared with the 5.25 MHz reference signal in phase comparator 205 to complete the phase locked loop. The 5.25 MHz reference signal creates an output stepsize of 5.25 MHz which provides coarse tuning for tuner 10. In the preferred embodiment, PLL1 21 has a bandwidth on the order of 500 KHz. A wide bandwidth is preferable to get good close-in phase noise characteristics.

Fine tuning is accomplished by LO2 which is produced by the operation of 3 phase lock loops PLL2 22, PLL3 23 and PLL4 24. PLL4 24 has the same basic configuration as PLL1 21. It has reference signal of 2.625 MHz which is input to phase comparator 235. The output of phase comparator 235 drives loop amplifier 232 which in turn drives VCO4 231. The output of VCO4 231 has a 2.625 MHz stepsize and it is provided to two divider circuits. One output of VCO4 231 goes to a divider network comprised of ÷6/÷7 circuit 233 and ÷N circuit 234. The effect of divider network 233 and 234 is to divide the output signal of VCO4 230 back down to 2.625 MHz. This signal is then compared with the 2.625 MHz reference signal in phase comparator 235 to complete the phase locked loop. The other output of VCO4 231 is provided to ÷42 circuit 230. The output of divider 230 is a signal with a 62.5 KHz stepsize that serves as a reference signal for PLL2 22.

The output of frequency divider 230 varies between 5.25 MHz and 10.5 MHz in 62.5 KHz steps. This signal is provided to phase comparator 214 which in turn drives loop amplifier 213. The output of loop amplifier 213 controls VCO2 210. VCO2 210 provides the LO2 signal for mixer 104 over line B. The other output from VCO2 210 passes through buffer amplifier 211 and then drives image reject mixer 212. Mixer 212 also receives an input from PLL3 23.

In PLL3 23, a 5.25 MHz reference signal is input to phase detector 222. Phase detector 222 drives loop amplifier 221 which in turn drives VCO3 220. The output of VCO3 23 is divided back down to 5.25 MHz by ÷N circuit 223 and then fed back into phase detector 222 to complete the loop. The output of VCO3 23 is in the range of 1 GHz which is close to the output frequency of VCO2 210. Therefore, buffer 211 is required to have good reverse isolation so that the signal from VCO3 220 does not leak through to the output of VCO2 210 and thereby get transmitted to mixer 104 as part of LO2.

In the preferred embodiment, the loop bandwidths of PLL2 22, PLL3 23 and PLL4 24 are all wide to provide good overall close-in phase noise. PLL2 22 and PLL3 23 have bandwidths of approximately 300–500 KHz. The bandwidth of PLL4 24 is approximately 200–300 KHz. These bandwidths give phase noise of around 100 KHz which is satisfactory for digital television.

The architecture of the frequency synthesis system provides for several benefits with respect to the overall operation of the tuner system. These benefits are in providing a lower distortion detection means, immunity to injection locking, a frequency synthesis system that allows for wide bandwidth PLLs while preserving a small step size, and providing for a choice of reference frequency that is out-of-band and that can be directly used to down-convert the audio portion of the desired channel.

A wide loop bandwidth for LO1 and LO2 is preferred because this yields good close-in phase noise characteristics for these two signals. This is important because it allows the COHO to have a narrow loop bandwidth, which yields a lower distortion video detector. For example, certain content within the video signal, such as the horizontal sync signal at approximately 15 KHz, would be partially tracked by a wide band COHO leading to distortion in the detection process. If the bandwidth of the COHO is less than 15 KHz, then the COHO would not partially track the horizontal sync signal leading to a near distortion free detection process. In the prior art, the oscillators used for conversion to IF typically do not have good close-in phase noise characteristics, requiring a COHO with wide loop bandwidth to track out this noise. It is thus typical in the prior art to employ wider bandwidth COHO's, which have the undesirable trait of partially tracking strong signals in the video signal, such as horizontal sync, leading to distortion in the detection process.

It is generally known that the immunity of a phase locked loop to injection locking is determined by the product of the quality factor, Q, of the VCO and the loop bandwidth. For the case of a VCO implemented on a single chip, it is typically difficult to realize high Qs. This conflicts with the integrated circuit implementation of a RF system with PLLs in that the other circuitry sharing the common substrate is a source of spurs that then may be passed on to the PLLs output or lead to injection locking by the PLL. A wide loop bandwidth of the PLL compensates for the fact that a high Q VCO is not feasible without external components.

It is typical in the prior art to make the PLL reference frequency equal to the step size of the frequency synthesizer system. It is further typical of the prior art to employ a single loop frequency synthesizer to create the first LO in tuners. For example, if the step size of the system was 62.5 KHz, then the reference frequency to the single loop PLL would also be 62.5 KHz. It is highly desirable to suppress harmonics and spurs of the reference that are in band to a level below the noise floor of the VCO, requiring the loop bandwidth of the PLL to be less than the reference frequency. In the case where the reference is the step size, the loop bandwidth is rather narrow. Consequently, it is a clear advantage of the frequency synthesizer described herein to provide both a small step size as well as a wide bandwidth for LO1 and LO2 providing for enhanced immunity to spurs as well as providing for a narrow bandwidth COHO.

A further advantage of the frequency synthesis system is that it can use a reference that is above the baseband frequencies. An example of such a frequency is 5.25 MHz. It should be noted that this 5.25 MHz reference is above the baseband signal of the system, thus avoiding in-band noise produced by the reference and its harmonics. A further advantage of this choice of reference is that it can be used directly by the audio subsystem to down convert the frequency modulated audio signal to a lower frequency usable by the sound filter and FM demodulator in the audio subsystem. This eliminates the need for a PLL to create this frequency.

Figure 3:
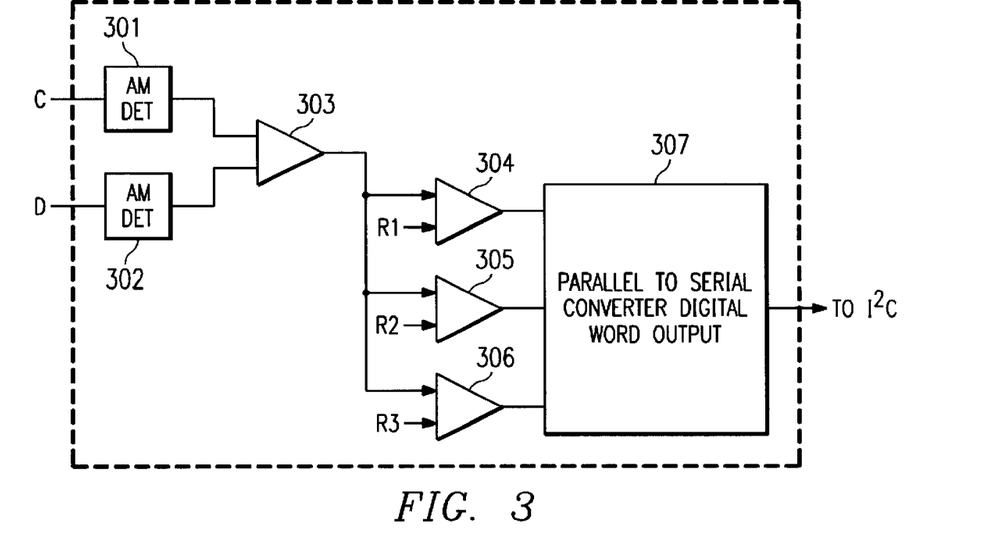
FIG. 3 shows the automatic carrier detection circuit used in the present invention.

FIG. 3 shows automatic carrier detection (ACD) circuit 30. The function of ACD circuit 30 is to detect whether the incoming channel is an analog signal or a digital signal. If an analog signal is detected, ACD 30 also determines if it has a suppressed carrier or if the signal has been scrambled. As shown in FIG. 3, ACD 30 has two input lines C and D. The input on line C is from the output of SIFFa 106. As discussed above and illustrated in FIG. 9, SIFFa 106 has a band pass characteristic that is suitable for digital television. Line D input is from the output of SIFFb 109. SIFFb 109 in combination with SIFFa 106 produces the band pass characteristics required for analog television, as shown in FIG. 8. ACD 30 operates by comparing the change in energy levels in the output of filters 106 and 109.

ACD 30 uses amplitude detectors 301 and 302 to detect the power coming out of SIFFa and SIFFb. These levels are then compared in comparator 303. The output of comparator 303 is then further compared with three different reference levels R1, R2 and R3. In the preferred embodiment, ACD 30 would compare the ratio of the output of SIFFa 106 to the output of SIFFb 109. If the received signal is an analog signal, then the ratio will be on the order of 6 dB. If the signal has a suppressed analog carrier, then the ratio will be on the order of 0 dB. For a digital signal the ratio will be on the order of 3 dB. The comparison in ACD 30 is provided by I²C 124 which adjusts switch 108 to select or deselect SIFFb 109.

In the embodiment shown, when ACD 30 analyzes the outputs of filters 106 and 109 the signal path of tuner 10 is configured for analog television. That is, SIFFb 109 will be selected into the signal path by switch 108. Following the comparison, if the signal is determined to be a digital television signal, SIFFb 109 will then be switched out of the signal path and attenuator 110 will be selected by switch 108.

Signal testing may be initiated by a channel change. In that case, every time a new channel is selected, both SIFFa 106 and SIFFb 109 are switched into the circuit and ACD 30 compares signal levels on lines C and D. Following the test, I²C 124 either switches SIFFb 109 out or leaves it in the signal path depending on whether an analog or digital signal is detected.

I²C 124 can initiate signal testing in ACD 30 depending on any number of other factors. Signal testing could be initiated by a channel change, as discussed above, or by a change in the input source. For instance, if an operator switched the input from an antenna or cable line to a videotape recorder or laser disk player, then the test could be initiated even though the operator did not change the channel. ACD testing may be automatic or user-initiated. For example, a television system may provide a function on a remote control which allows the user to select the "test mode."

In an alternative embodiment of tuner 10, ACD 30 is directly connected into the output of SIFFb 109 and SIFFb is always connected to amplifier 107. This configuration would not require switch 108 to select SIFFb 109 into the signal path in order to conduct the signal test. As shown by dashed lines 130 and 131 on FIG. 1, SIFFb 109 could be configured to continuously receive the output of amplifier 107 over line 130. Input D to ACD 30 would be provided over line 131 directly from the output of SIFFb 109 rather than from the output of switch 108. This would allow ACD 30 to continuously conduct the analog/digital signal determination test without regard to the position of switch 108. Switch 108 would only be changed to properly configure the signal path as required for the signal type detected.

Figure 4:
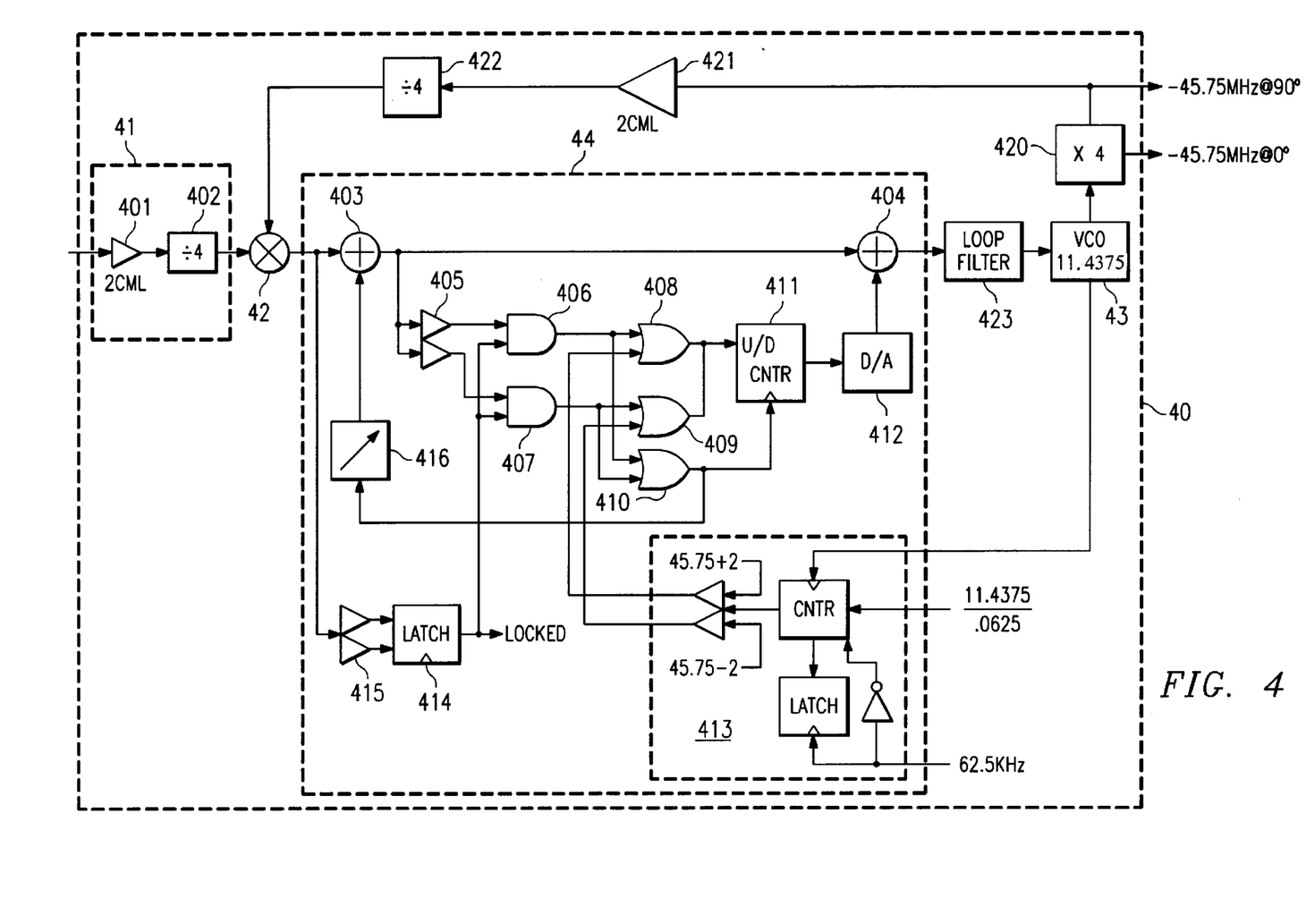
FIG. 4 shows the coherent oscillator circuit of the present invention.

COHO 40, shown in FIG. 4, is comprised of a phase locked loop which provides reference signals to detectors 50a and 50b. The reference signal for detector 50a is at 0° relative to the carrier signal for the analog or digital signal. The reference signal for down converter 50b is at 90° with the phase of the carrier signal. The input to COHO 40 is provided from amplifier 111 through converting circuit 41. The signal passes through current mode logic circuit 401 and divider 402. VCO 43 of COHO 40 runs at one quarter the frequency of the carrier signal. Circuit 41 converts the input signal to current mode logic and then divides the signal frequency by 4 to match the frequency in the loop. Following divider 402, the signal goes into phase detector 42.

The output of phase detector 42 passes through control circuit 44 and loop filter 423 and is then input to VCO 43.

Assuming that COHO 40 is locked right on the 45.75 MHz picture carrier for analog television, VCO 43 will normally operate at 11.4375 MHz. The output of VCO 43 passes through frequency multiplier 420 which works in conjunction with VCO 43 to produce the in-phase/0° and quadrature/90° outputs at 45.75 MHz for detectors 50a and 50b. The output from multiplier 420 also feeds back to phase detector 42 through current mode logic converter 421 and divider 422 to complete the phase locked loop circuit.

Control logic 44 is used in signal acquisition to ensure that COHO 40 searches in the correct direction and locks on the picture carrier for analog television signals, 801 of FIG. 8, as opposed to locking on the neighboring audio signal 803. Control 44 does an upsweep search looking for the picture carrier 801 to avoid locking on to the higher frequency audio carrier 803. This is important for situations in which the carrier is off-frequency. For example, in a cable television analog signal, the carrier frequency can be off by up to 2 MHz. Accordingly, COHO 40 needs control 44 to ensure that the loop locks onto the proper frequency. It is likely that digital television signals will also vary up to 2 MHz from the expected frequency in some situations. Therefore, control 44 is used for both analog and digital signals.

Circuit 413 compares the actual output frequency of VCO 43 with the expected frequency of 11.4375 MHz. Circuit 413 generates an error signal which is provided to control logic gates 408–410. The output of gates 408–410 goes into up-down counter 411. Digital-to-analog converter 412 converts the output of counter 411 to an analog error signal which is added into the signal path by adder 404. The output of adder 404 provides an offset control signal for VCO 43.

Sweep circuit 416 forces control 44 to search from lower frequencies to higher frequencies to avoid locking on audio signal 803 instead of picture carrier 801. The output of sweep circuit 416 is provided to adder 403 which adds an offset to the output of phase detector 42 to force this sweep in the right direction. This low-to-high acquisition could also be implemented by setting the bias for VCO 43 to a low level, thereby forcing the output of VCO 43 to a low frequency. The error signal from phase detector 42 would then pull the bias for VCO 43 up in frequency in which case it will sweep in the correct direction.

Detector 415 and latch 414 function as a lock detection circuit. The signal from phase detector 42 is compared to a reference signal and if the signal is inside the reference then it is locked, otherwise it is not locked. The signal from latch 414 is provided to logic gates 406 and 407 along with the output of comparator 405. The output of gates 406 and 407 serves as the other input for logic gates 408–410. I have found that dividers 402 and 422 may not be necessary.

Figure 5:
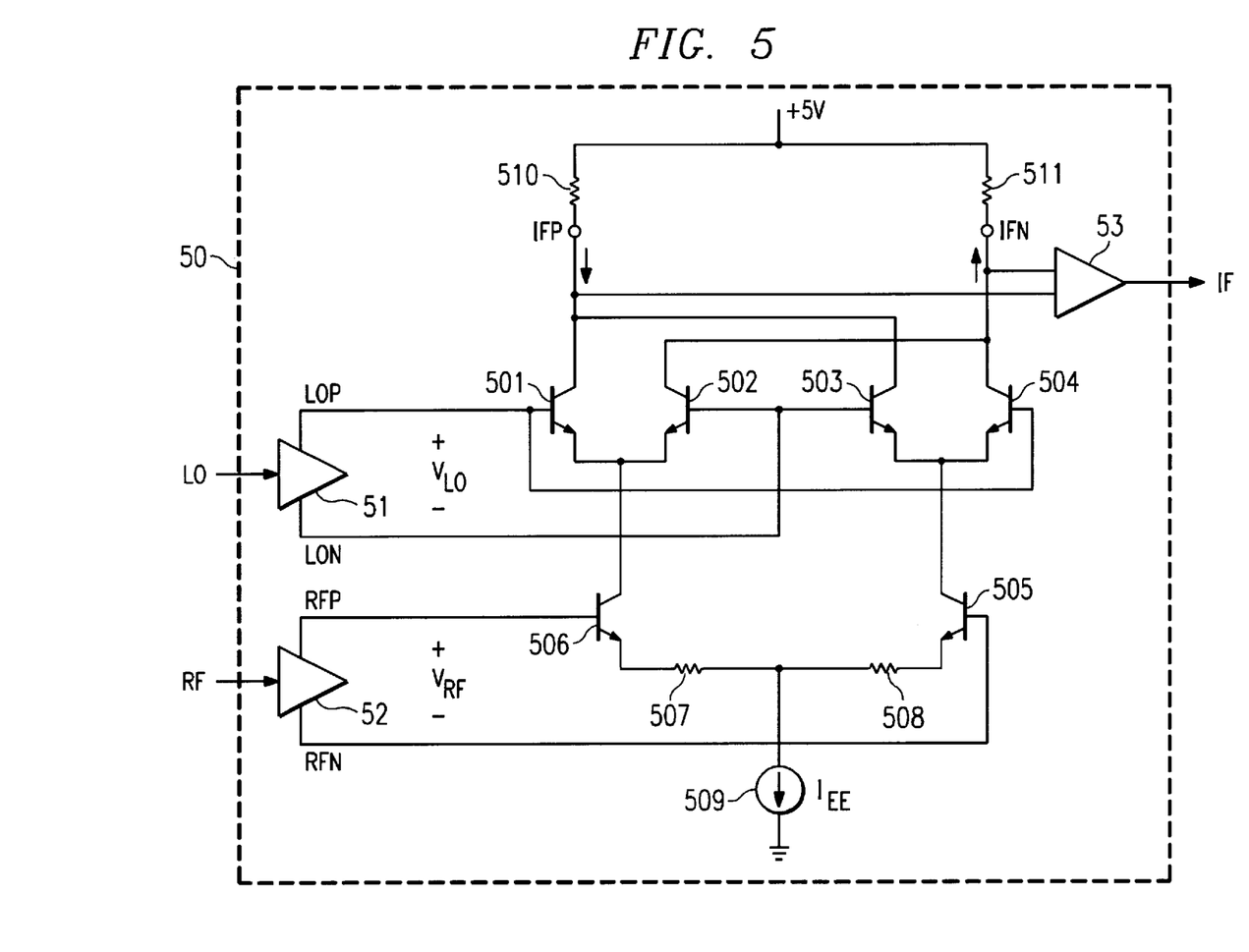
FIG. 5 shows the Gilbert cell mixer circuit used as a detector in the present invention.

FIG. 5 show the components of a Gilbert cell mixer such as that used for detectors 50a and 50b. The inputs to the Gilbert cell are a local oscillator (LO) signal and a RF signal. For video/in-phase detector 50a, the LO is an in-phase signal from COHO 40. Audio/quadrature detector 50b receives a 90° phase signal from COHO 40 as the LO. The signals in the preferred embodiment are balanced but for clarity they are shown as single inputs to buffers 51 and 52. Mixer 50 itself is totally balanced and receives balanced inputs. The output of mixer 50 is also balanced although it is shown as a single ended output through buffer 53 for simplification of the drawings.

Mixer 50 is a common Gilbert cell with a top section of transistors, 501, 502, 503, and 504 which are switched on and off by the LO signal. Transistors 506 and 505 are modulated with the RF signal input. In the preferred embodiment shown in FIG. 1, the RF signal is provided by amplifier 111. Resistors 507 and 508 are used to provide or improve circuit linearity. Current source 509 provides the current to drive the system and may be implemented by any number of current circuits that are well known in the art. Resistors 510 and 511 provide biasing for the collectors of transistors 501–504.

Figure 6:
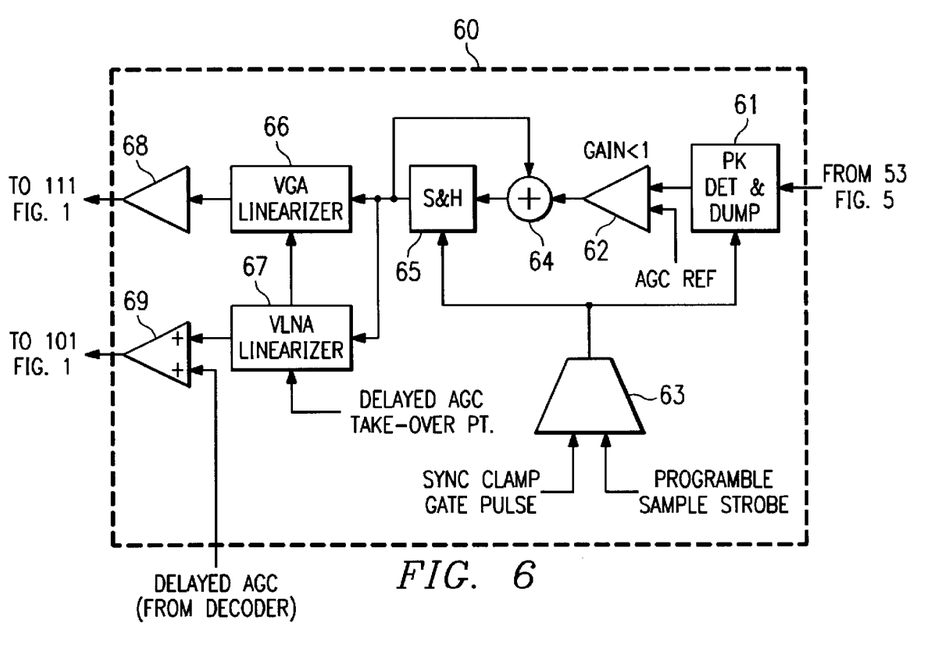
FIG. 6 (shown on sheet 3 of the drawings) shows the automatic gain control circuit of the invention.

AGC Circuit 60 is shown in further detail in FIG. 6. AGC 60 operates to control the gain of tuner 10 by adjusting the gain of amplifiers 101 and 111. First, IF AGC amplifier 111 is used to lower the overall receiver gain. Once amplifier 111 reaches a minimum gain level on the order of 25 dB, then delayed AGC amplifier 101 is adjusted to attenuate the signal at the front end of tuner 10.

AGC 60 receives an input from video detector 50a. The input signal goes into peak detect and dump circuit 61. By constructing AGC 60 on-chip the use of large capacitors for storage is not practical. So peak detect and dump circuit 61 searches for the peak signal level and holds that until it gets sampled on a command from selector 63. Selector 63 can select between a sync clamp pulse or a programmable sample strobe. A sync clamp circuit (not shown) provides the sync clamp pulse for analog television signals. Use of the sync clamp pulse phase locks the operation of AGC 60 to the horizontal sync of the analog television signal. The sync pulse is the largest signal in the analog television signal and so it provides an easily useable synchronous means of sampling signals for AGC 60. The sync pulse does not apply for digital television or for a scrambled analog television signal in which the picture carrier reference signal is typically suppressed. For those cases where the sync pulse is not available or if the sync clamp circuit is not used, a programmable sample strobe is used.

Peak detect and dump 61 works with both analog and digital television signals and provides an output to loop amplifier 62. Loop amplifier 62 receives an AGC reference signal that is provided by $I^2C$ 124. The output of amplifier 62 goes into sample and hold circuit 65. Sample and hold 65 also receives a sample strobe from selector 63. As a result, the output of sample and hold 65 is also strobed. The output is fed back and added to the input by integrator 64. The output of sample and hold 65 goes to linearizer circuits 66 and 67, which linearize the control current for amplifiers 111 and 101.

In an alternative embodiment, the AGC reference can bypass loop amplifier 62 and sample and hold 65 and go directly into linearizers 66 and 67. This would allow for manual control of the receiver gain for test purposes. The programmable sample strobe from selector 63 is made programmable to allow for variable AGC loop bandwidths. By changing divide ratios the loop bandwidth can be varied and optimized for various television signals.

AGC 60 can also receive a delayed AGC input from an off-chip decoder. When tuner 10 is used with a decoder that receives an IF signal from buffer 112, the decoder can provide an input back into AGC 60 to directly control the end gain at AGC amplifier 101 and IF amplifier 111.

Sound trap 70 can either be an on-chip or off-chip device. FIG. 7A shows an on-chip design for sound trap 70 that is implemented with several stages of circuits having relatively low Q poles and zeros. The intent of sound trap 70 is to provide a null at the sound carrier frequency of 4.5 MHz as shown in FIG. 7B. This prevents the sound carrier signal from passing to the output of the video port at buffer 115. Sound trap 70 is optimally designed to have a minimal amount of ripple in-band and in the notch at 4.5 MHz. It should also have a fall off in the out-of-band response to suppress noise and spurious signals. The basic circuit shown in FIG. 7A has a series of bi-quad circuits which are used to implement the poles and zeros necessary to obtain the desired frequency response. Circuits 71–75 each provide two stages of filtering for a total of ten filter stages. The filters are followed by buffer stage 76. Circuit 77 provides bias control for filter stages 71–75 and buffer 76.

While it is expected that the disclosed tuner would be utilized to process co-existing digital and analog television signals, it would also be possible to use the tuner to process signals with multiple co-existing digital or analog formats. A digital television standard in the United States may vary from the digital standard used in Japan, European or elsewhere. The varying analog television signal standards illustrate the potential for different standards in different countries. For example, in the United States the National Television Systems Committee (NTSC) standard has a video bandwidth of 4.2 MHz and a sound carrier at 4.5 MHz. On the other hand, in Britain the Phase Alternate Line (PAL) standard has a 5.5 MHz video bandwidth and a sound carrier at 6 MHz. It may be practical in digital television systems to provide a tuner which allows processing of various types of digital standards. Furthermore, it may be necessary to provide a tuner which allows for more than two signal formats to be processed. The disclosed tuner could also be embodied to provide multiple output signals which correspond to more than just simple analog and digital formats. Of course, the tuner described herein could be used in a known (or unknown) single system format by presetting certain values, either in response to a separately received central signal, or manually, or a decoded control signal. In such a context it could be advantageous to use the range of input filter 100, either on its high or low side, or both. This variable control can be manual, or under control of an applied signal on a dynamic basis.

In the preferred embodiment the disclosed tuner would be manufactured on a single integrated circuit substrate. However, design considerations may require that certain elements be embodied as discrete devices (herein called off-chip) instead of incorporating the elements into an integrated substrate. For instance, the IF filters, analog-to-digital converter, sound trap filter or input filter may be incorporated as off-chip elements as necessary while still achieving the desired dual mode tuning circuit. For purpose of design, a single board, or chip, could contain multiple "off-chip" elements and one or more integrated circuits. In such a context, the designation "off-chip" simply implies that some of the elements are all not within a common substrate.

Another alternative design would simplify FIFF 103, thereby allowing the entire range of channels in the RF signal to be converted to the second IF signal. In this embodiment, the conversion circuit could be constructed entirely on an integrated substrate and filtering of unwanted channels could be accomplished after the RF signal has been converted to a second IF signal.

Although the present invention and its advantages have been described in detail, it should be understood that various changes, substitutions and alterations can be made herein without departing from the spirit and scope of the invention as defined by the appended claims.

What is claimed is:

1. A receiver comprising:
   an input for receiving an RF signal having a plurality of channels, wherein said channels are in either a first signal format or a second signal format;

a conversion circuit for converting received RF signals to IF signals;

a first signal filter receiving said IF signals from said conversion circuit and having a frequency response suitable for passing channels in said first signal format;

a second signal filter switchably coupled to an output of said first signal filter and providing a combined frequency response suitable for passing channels in said second signal format when operating with said first signal filter;

wherein said conversion circuit is a dual conversion circuit comprising:

a first mixer having a first input for receiving said RF signal and a second input coupled to a first reference signal; and a second mixer having a first input coupled to said first mixer and a second input coupled to a second reference signal, wherein said second reference signal provides fine tuning by three VCOs and wide band phase lock loops providing a highly coherent reference signal suitable for down-converting said signal of said first signal format and said signal of said second signal format.

2. The receiver of claim 1 further comprising an input filter coupled between said receiver input and said conversion circuit for removing all frequencies above an input cutoff frequency in said RF signal.

3. The receiver of claim 1 wherein said first format is a digital television signal format.

4. The receiver of claim 3 wherein said format is an analog television signal format.

5. The receiver of claim 1 wherein said second mixer is an image rejection mixer.

6. The receiver of claim 1 wherein said dual conversion circuit further comprises an IF filter coupled between said first mixer and said second mixer.

7. The receiver of claim 6 wherein said second mixer and said IF filter operate to reject an image frequency from said IF signal.

8. The receiver of claim 1 further comprising a coherent reference phase lock loop fed by such second IF signal for generating a third reference signal, and a frequency synthesizer for generating said first and second reference signals, said frequency synthesizer having a phase noise characteristic that allows said coherent reference phase lock loop to have a narrow loop bandwidth.

9. The receiver of claim 8, wherein a crystal connected to an oscillator circuit provides a signal to said frequency synthesizer for generating said first and second reference signals.

10. The receiver of claim 9 constructed substantially on a single integrated circuit substrate.

11. The receiver of claim 10, wherein said crystal is not physically located on said single integrated circuit substrate.

12. The receiver of claim 11, wherein said crystal is a 5.25 MHz crystal.

13. The receiver of claim 1 wherein said first reference signal provides coarse tuning and wherein said second reference signal provides fine tuning.

14. The receiver of claim 1 wherein said first reference signal provides coarse tuning with step size of greater than 4.5 MHz.

15. The receiver of claim 13 wherein said coarse tuning is provided by a single voltage controlled oscillator and a wide band phase lock loop providing a highly coherent reference signal suitable for up-converting said signal of said first format and for said signal of said second format.

16. The receiver of claim 15 wherein the phase lock loop reference signal is greater than 4.5 MHz.

17. The receiver of claim 1 wherein said phase lock loops utilize two reference frequencies, one greater than 2.25 MHz and the other greater than 4.5 MHz.

18. The receiver of claim 1 constructed substantially on a single integrated circuit substrate.

19. The receiver of claim 18, wherein said first and second signal filters are not physically located on said single integrated circuit substrate.

20. The receiver of claim 1 further comprising a format detector for detecting whether one of said channels comprises either said first signal format or said second signal format, and wherein said format detector is coupled to said first signal filter and said second signal filter.

21. A receiver comprising:

an input for receiving an RF signal having a plurality of channels, wherein said channels are in either a first signal format or a second signal format;

a conversion circuit for converting received RF signals to IF signals;

a first signal filter receiving said IF signals from said conversion circuit and having a frequency response suitable for passing channels in said first signal format; and a second signal filter switchably coupled to an output of said first signal filter and providing a combined frequency response suitable for passing channels in said second signal format when operating with said first signal filter;

wherein said conversion circuit includes a circuit for providing first and second reference signals, said circuit including:

a plurality of PLLs, wherein a first PLL accepts a reference signal which is out of the bandwidth of each selected frequency, said PLLs having low phase noise and a step size resolution smaller than the loop bandwidth of the individual PLLs; and wherein said PLLs operate from input reference signals some of which are outside of said bandwidth, and at least one of which is within said bandwidth and wherein said one within said bandwidth is isolated from said output reference signals.

22. The receiver of claim 21 wherein a first one of said PLLs provides coarse frequency resolution under control of said out of band input reference signal and wherein the step size of said coarse resolution is substantially equal to the frequency of said out of band input reference signal.

23. The receiver of claim 22 wherein a second set of PLLs provides fine frequency resolution under control of a combination of said out of band input reference signals and said isolated in band input reference signals.

24. The circuit of claim 23 constructed substantially on a single integrated circuit substrate.

25. The receiver of claim 24, wherein said first and second signal filters are not physically located on said single integrated circuit substrate.

26. A receiver comprising:

an input for receiving an RF signal having a plurality of channels, wherein said channels are in either a first signal format or a second signal format;

a conversion circuit for converting received RF signals to IF signals;

a first signal filter receiving said IF signals from said conversion circuit and having a frequency response suitable for passing channels in said first signal format;

a second signal filter switchably coupled to an output of said first signal filter and providing a combined frequency response suitable for passing channels in said second signal format when operating with said first signal filter; and a coherent oscillator switchably coupled to an IF output from either said first signal filter or said second signal filter and providing a first reference signal.

27. The receiver of claim 26 wherein said coherent oscillator provides said first reference signal for channels having either said first signal format or said second signal format.

28. The receiver of claim 27 wherein said first reference signal is in-phase with said IF output.

29. The receiver of claim 27 further comprising a first detector having a first input coupled to said IF output and a second input coupled to said first reference signal.

30. The receiver of claim 29 further comprising an in-phase digital output circuit coupled to an output of said first detector and outputting an in-phase digital signal when a selected channel in said RF signal is in a digital format.

31. The receiver of claim 29 further comprising an analog video output circuit coupled to an output of said first detector and outputting a composite analog video signal when a selected channel in said RF signal is in an analog format.

32. The receiver of claim 29 further comprising an automatic gain control circuit coupled to an output of said first detector and adjusting an automatic gain control amplifier to control an overall receiver gain.

33. The receiver of claim 26 wherein said coherent oscillator is switchably coupled to an IF output from either said first signal filter or said second signal filter and providing a second reference signal.

34. The receiver of claim 33 wherein said coherent oscillator provides said second reference signal for channels having said second signal format.

35. The receiver of claim 34 wherein said second reference signal is 90° out-of-phase with said IF output.

36. The receiver of claim 33 further comprising a second detector having a first input coupled to said IF output and a second input coupled to said second reference signal.

37. The receiver of claim 36 further comprising a digital quadrature output circuit coupled to said second detector and outputting a quadrature digital signal when a selected channel in said RF signal is in a digital format.

38. The receiver of claim 36 further comprising an analog audio output circuit to said detector and outputting a composite audio signal when a selected channel in said RF signal is in an analog format.

39. The receiver of claim 36 constructed substantially on a single integrated circuit substrate.

40. A method of receiving signals comprising the steps of:
receiving an RF signal having a plurality of channels;
converting said RF signal to an IF signal, wherein said IF signal contains all of said plurality of channels;
producing a filtered IF signal by selectively filtering said IF signal either through a first IF filter or through a first IF filter and a second IF filter;
creating a first reference signal from said filtered IF signal, wherein said first reference signal is in phase with said filtered IF signal; and
generating an in-phase signal by mixing said first reference signal with said filtered IF signal.

41. The method of claim 40 further including the step of:
creating a second reference signal from said filtered IF signal wherein said second reference signal is phase-shifted 90° from said filtered IF signal.

42. The method of claim 41 further including the step of:
creating a second reference signal; and
generating a quadrature signal by mixing said second reference signal with said filtered IF signal.

43. The method of claim 42 wherein a selected one of said channels is in a digital television format and wherein said IF signal is filtered only through said first IF filter; and
further comprising the steps of:
creating an in-phase digital television signal by filtering said generated in-phase signal; and
creating a quadrature digital television signal by filtering said generated quadrature signal.

44. The method of claim 42 wherein a selected one of said channels is in an analog television format and wherein said IF signal is filtered through both said first IF filter and said second IF filter; and
further comprising the steps of:
creating a composite video signal by filtering said detected in-phase signal; and
creating a composite audio signal by filtering said detected quadrature signal.

45. The method of claim 42 further comprising the steps of:
detecting a signal level of said in-phase signal; and
adjusting the gain of both an IF signal amplifier and an input amplifier.

46. The method of claim 40 further comprising the step of:
detecting a format of information carried by one of said channels by comparing an output of said first IF filter with an output of said second IF filter.

47. The method of claim 40 further comprising the step of:
filtering said received RF signal to remove all frequencies above an input cutoff frequency.

48. The method of claim 40, performed substantially on a single integrated circuit substrate.

49. The method of claim 48, wherein said first and second IF filters are not physically located on said single integrated circuit substrate.

50. A tuner comprising:
means for receiving an RF signal having a plurality of channels;
means for converting said RF signal to an IF signal;
means for selectively filtering said IF signal through a first filter or through said first filter and a second filter, wherein said first filter is suitable for passing a first format of data and a combination of said first filter and said second filter is suitable for passing a second format of data;
means for generating a first reference signal; and
means for producing a first output signal from said filtered IF signal and said first reference signal.

51. The tuner of claim 50 further including:
means for generating a second reference signal from said filtered IF signal; and
means for producing a second output signal from said filtered IF signal and said second reference signal.

52. The tuner of claim 51 wherein substantially all of said means are on a single integrated circuit substrate.

53. The tuner of claim 51 wherein said second reference signal is 90° out-of-phase with said filtered IF signal.

54. The tuner of claim 53 wherein a selected channel contains digital information and said IF signal is filtered through said first IF filter; and wherein said first reference signal is in-phase with said filtered IF signal; and wherein said first output signal corresponds to an in-phase output for a digital television signal and said second output signal corresponds to a quadrature output for a digital television signal.

55. The tuner of claim 51 wherein a selected channel contains analog information and said IF signal is filtered through said combination of said first IF filter and said second IF filter; and wherein said first output signal corresponds to a composite video output for an analog television signal and said second output signal corresponds to a composite audio output for an analog television signal.

56. The tuner of claim 50 wherein said first reference signal is in-phase with said filtered IF signal.

57. The tuner of claim 50 further comprising:

means for detecting a format type for a selected one of said channels, wherein said detecting means compares the signal levels output from said first IF filter and said second IF filter.

58. A receiver comprising:

an input for receiving an RF signal having a plurality of channels, wherein said channels are in either a first signal format or a second signal format;

a conversion circuit for converting received RF signals to IF signals;

a first signal filter receiving said IF signals from said conversion circuit and having a frequency response suitable for passing channels in said first format;

a substitute filter switchably replacing said first signal filter for providing a frequency response suitable for passing channels in said second format; and an input filter coupled between said receiver input and said conversion circuit for removing all frequencies above an input cutoff frequency in said RF signal;

wherein said conversion circuit includes a circuit for providing first and second reference signals, said circuit comprising:

a plurality of PLL, wherein a first PLL accepts a reference signal which is out of the bandwidth of each selected channel, said PLLs having low phase noise and a step size resolution smaller than the loop bandwidth of the individual PLLs; and wherein said PLL operates from input reference signals some of which are outside of said channel bandwidth, at least one of said input reference signals is within said channel bandwidth, and said at least one said input reference signal within said channel bandwidth is isolated from said output reference signals.

59. The receiver of claim 58 wherein said first format is a digital television signal format.

60. The receiver of claim 58 wherein said second format is an analog television signal format.

61. The receiver of claim 58 wherein said conversion circuit is a dual conversion circuit comprised of:

a first mixer having a first input for receiving said RF signal and a second input coupled to a first reference source; and a second mixer having a first input coupled to said first mixer and a second input coupled to a second reference signal.

62. The receiver of claim 61 wherein said second mixer is an image rejection mixer.

63. The receiver of claim 61 wherein said dual conversion circuit further comprises an IF filter coupled between said first mixer and said second mixer.

64. The receiver of claim 63 constructed substantially on a single integrated circuit substrate.

65. The receiver of claim 64, wherein said IF filter is not located on said single integrated circuit substrate.

66. The receiver of claim 63, wherein all of said filters are not physically located on said single integrated circuit substrate.

67. The receiver of claim 63 wherein said second mixer and said IF filter operate to reject an image frequency from said IF signal.

68. The receiver of claim 58 wherein a first one of said PLL provides coarse frequency resolution under control of said out of band input reference signal and wherein the step size of said coarse resolution is substantially equal to the frequency of said out of band input reference signal.

69. The receiver of claim 68 wherein a second set of PLLs provides fine frequency resolution under control of a combination of said out of band input reference signals and said isolated in band input reference signals.

70. The circuit of claim 69 constructed substantially on a single integrated circuit substrate.

71. The receiver of claim 58 further comprising a format detector for detecting whether one of said channels comprises either said first signal format or said second signal format, and wherein said format detector is coupled to said first signal filter and said second signal filter.

72. A receiver comprising:

an input for receiving an RF signal having a plurality of channels, wherein said channels are in either a first signal format or a second signal format;

a conversion circuit for converting received RF signals to IF signals;

a first signal filter receiving said IF signals from said conversion circuit and having a frequency response suitable for passing channels in said first format;

a substitute filter switchably replacing said first signal filter for providing a frequency response suitable for passing channels in said second format; and a a coherent oscillator switchably coupled to an IF output from either said first signal filter or said substitute signal filter and providing a first reference signal.

73. The receiver of claim 72 wherein said coherent oscillator provides said first reference signal for channels having either said first signal format or said second signal format.

74. The receiver of claim 73 wherein said first reference signal is in-phase with said IF output.

75. The receiver of claim 73 further comprising a first detector having a first input coupled to said IF output and a second input coupled to said first reference signal.

76. The receiver of claim 75 further comprising an in-phase digital output circuit coupled to an output of said first detector and outputting an in-phase digital signal when a selected channel in said RF signal is in a digital format.

77. The receiver of claim 75 further comprising an analog video output circuit coupled to an output of said first detector and outputting a composite analog video signal when a selected channel in said RF signal is in an analog format.

78. The receiver of claim 75 further comprising an automatic gain control circuit coupled to an output of said first detector and adjusting an automatic gain control amplifier to control an overall receiver gain.

79. The receiver of claim 72 wherein said coherent oscillator is switchably coupled to an IF output from either said first signal filter or said substitute signal filter and provides a second reference signal.

80. The receiver of claim 79 wherein said coherent oscillator provides said second reference signal for channels having said second signal format.

81. The receiver of claim 80 wherein said second reference signal is 90° out-of-phase with said IF output.

82. The receiver of claim 79 further comprising a second detector having a first input coupled to said IF output and a second input coupled to said second reference signal.

83. The receiver of claim 58 constructed substantially on a single integrated circuit substrate.

84. The receiver of claim 83, wherein said first signal filter and said substitute filter are not physically located on said single integrated circuit substrate.

85. The receiver of claim 83, wherein said input filter is not physically located on said single integrated circuit substrate.

86. The receiver of claim 58 wherein all of said filters are not physically located on said single integrated circuit substrate.

87. The receiver of claim 39, wherein said first and second signal filters are not physically located on said single integrated circuit substrate.

88. The receiver of claim 39, wherein said conversion circuit is not physically located on said single integrated circuit substrate.

89. The tuner of claim 52, wherein said first and second filters are not physically located on said single chip.

* * * * *